(12) United States Patent
Wang

(10) Patent No.: US 11,742,398 B2
(45) Date of Patent: Aug. 29, 2023

(54) SEMICONDUCTOR DEVICE WITH ISOLATION BETWEEN CONDUCTIVE STRUCTURES

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/450,246

(22) Filed: Oct. 7, 2021

(65) Prior Publication Data

US 2022/0028988 A1    Jan. 27, 2022

Related U.S. Application Data

(62) Division of application No. 16/922,730, filed on Jul. 7, 2020, now Pat. No. 11,205,703.

(30) Foreign Application Priority Data

Jul. 8, 2019  (CN) .......................... 201910609645.8

(51) Int. Cl.
*H01L 29/41* (2006.01)
*H01L 29/417* (2006.01)
(Continued)

(52) U.S. Cl.
CPC .. *H01L 29/41741* (2013.01); *H01L 21/28568* (2013.01); *H01L 21/31116* (2013.01);
(Continued)

(58) Field of Classification Search
CPC ........... H01L 29/41741; H01L 29/7827; H01L 29/0649; H01L 29/66666; H01L 21/31116;
(Continued)

(56) References Cited

U.S. PATENT DOCUMENTS 9,490,317 B1 * 11/2016 Labonte ............ H01L 21/76897
9,508,825 B1 * 11/2016 Basker .............. H01L 29/66545
(Continued)

*Primary Examiner* — Mohammad M Hoque
(74) *Attorney, Agent, or Firm* — Anova Law Group, PLLC

(57) ABSTRACT

A semiconductor device is provided. The semiconductor device includes a base substrate; a gate structure on the base substrate; source/drain doped layers in the base substrate on sides of the gate structure; a first dielectric layer on the base substrate and covering the source/drain doped layers; a mask layer on a top of the gate structure between the source/drain doped layers; a second dielectric layer on the first dielectric layer and exposing a surface of the mask layer; first grooves in the second dielectric layer and the first dielectric layer, and exposing the source/drain doped layers; a first conductive structure in each first groove; a second groove in the (Continued)

mask layer, and exposing the gate structure at a bottom of the second groove; and a spacer on sidewalls of the second groove.

10 Claims, 21 Drawing Sheets

(51) Int. Cl.
  *H01L 29/78* (2006.01)
  *H01L 29/06* (2006.01)
  *H01L 29/66* (2006.01)
  *H01L 21/311* (2006.01)
  *H01L 21/285* (2006.01)
  *H01L 29/08* (2006.01)

(52) U.S. Cl.
  CPC .... *H01L 21/31144* (2013.01); *H01L 29/0649* (2013.01); *H01L 29/0847* (2013.01); *H01L 29/66666* (2013.01); *H01L 29/7827* (2013.01)

(58) Field of Classification Search
  CPC ......... H01L 21/31144; H01L 21/28568; H01L 29/0847; H01L 21/76897; H01L 21/76831; H01L 29/41791; H01L 29/66795; H01L 29/66545; H01L 29/6656; H01L 29/785; H01L 21/76802; H01L 29/0653; H01L 23/5386
  USPC ....................................................... 257/329
  See application file for complete search history.

(56) References Cited

U.S. PATENT DOCUMENTS

| | | |
|---|---|---|
| 9,711,402 B1 | 7/2017 | Huang et al. |
| 2004/0203211 A1* | 10/2004 | Yang .................. H01L 29/41791 |
| | | 257/E21.507 |
| 2015/0108589 A1 | 4/2015 | Cheng et al. |
| 2016/0211251 A1* | 7/2016 | Liaw ...................... H01L 27/088 |
| 2016/0268203 A1 | 9/2016 | Lu et al. |
| 2016/0365426 A1* | 12/2016 | Ching .................... H01L 29/785 |
| 2017/0186692 A1 | 6/2017 | Zhao |
| 2018/0097059 A1* | 4/2018 | Bi .......................... H01L 29/401 |
| 2018/0151431 A1 | 5/2018 | Wang |
| 2018/0166469 A1 | 6/2018 | Zhang |
| 2018/0174904 A1* | 6/2018 | Hsieh .................. H01L 23/5226 |
| 2018/0248013 A1* | 8/2018 | Chowdhury ........ H01L 29/7833 |
| 2019/0115249 A1* | 4/2019 | Koh .................. H01L 21/823431 |
| 2019/0115256 A1* | 4/2019 | Wang ................ H01L 21/76877 |
| 2019/0334008 A1* | 10/2019 | Chen .................... H01L 29/4991 |
| 2020/0044072 A1 | 2/2020 | Chiang et al. |
| 2020/0126857 A1* | 4/2020 | Tsai ........................ H01L 29/78 |
| 2020/0127109 A1* | 4/2020 | Wang .................. H01L 21/7682 |
| 2020/0135912 A1* | 4/2020 | Tsai .................... H01L 21/02362 |
| 2020/0176324 A1* | 6/2020 | Zang .................. H01L 21/76897 |
| 2020/0203531 A1* | 6/2020 | Tsai .................. H01L 29/66795 |
| 2020/0227424 A1 | 7/2020 | Tran et al. |
| 2020/0303559 A1* | 9/2020 | Huang ............. H01L 21/02164 |
| 2020/0395237 A1* | 12/2020 | Lin ...................... H01L 29/0847 |
| 2021/0335849 A1* | 10/2021 | Liu ...................... H01L 27/1255 |

* cited by examiner

SEMICONDUCTOR DEVICE WITH ISOLATION BETWEEN CONDUCTIVE STRUCTURES

CROSS-REFERENCES TO RELATED APPLICATION

This application is a divisional of U.S. patent application Ser. No. 16/922,730, filed on Jul. 7, 2020, which claims the priority of Chinese Patent Application No. 201910609645.8, filed on Jul. 8, 2019, the content of which is incorporated herein by reference in its entirety.

TECHNICAL FIELD

The present disclosure generally relates to the field of semiconductor technologies and, more particularly, relates to a semiconductor device and its fabrication method.

BACKGROUND

With rapid development of semiconductor fabrication technologies, semiconductor devices develop towards a higher device density and a higher integration level. A transistor device is widely used currently as a most basic semiconductor device. The transistor device may be a planar device. However, the control capability of existing planar devices on the channel current becomes weaker, resulting in short channel effect and leakage currents. Electrical performance of the semiconductor device is therefore affected.

A fin field effect transistor (Fin FET) is a common multi-gate device and may include fins and an isolation structure on a surface of a semiconductor substrate, a gate structure on the semiconductor substrate and across the fins, and a source region and a drain region in a corresponding fin on sides of the gate structure. The isolation structure covers a portion of sidewalls of the fins.

Therefore, there is a need to provide a semiconductor device with decreased size and improved performance, and its fabrication method.

SUMMARY

One aspect of the present disclosure provides a fabrication method for forming a semiconductor device. The method includes: providing a gate structure and a first dielectric layer on a substrate; providing source/drain doped layers in the base substrate on sides of the gate structure; forming a mask layer on the gate structure between the source/drain doped layers; forming a second dielectric layer on the first dielectric layer and exposing the mask layer; etching the second dielectric layer and the first dielectric layer using the mask layer as an etch mask, to form first grooves on the sides of the gate structure and exposing the source/drain doped layers; forming a first conductive structure in each first groove; patterning the mask layer to form a second groove in the mask layer to expose the gate structure at the bottom of the second groove; and forming a spacer on sidewalls of the second groove.

Another aspect of the present disclosure provides a semiconductor device. The device includes: a base substrate; a gate structure on the base substrate; source/drain doped layers in the base substrate on sides of the gate structure; a first dielectric layer on the base substrate and covering the source/drain doped layers; a mask layer on a top of the gate structure between the source/drain doped layers; a second dielectric layer on the first dielectric layer and exposing a surface of the mask layer; first grooves in the second dielectric layer and the first dielectric layer, and exposing the source/drain doped layers; a first conductive structure in each first groove; a second groove in the mask layer and exposing the gate structure; and a spacer on sidewalls of the second groove.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In a semiconductor device, a first conductive structure connecting a first metal interconnection layer to a source/drain doped layer, and a second conductive structure connecting the first conductive structure to a gate structure, are usually required. A short circuit problem appears easily in the semiconductor devices formed by technologies of the prior art. The formed semiconductor devices easily break down and their application is limited thereby.

Figure 1:
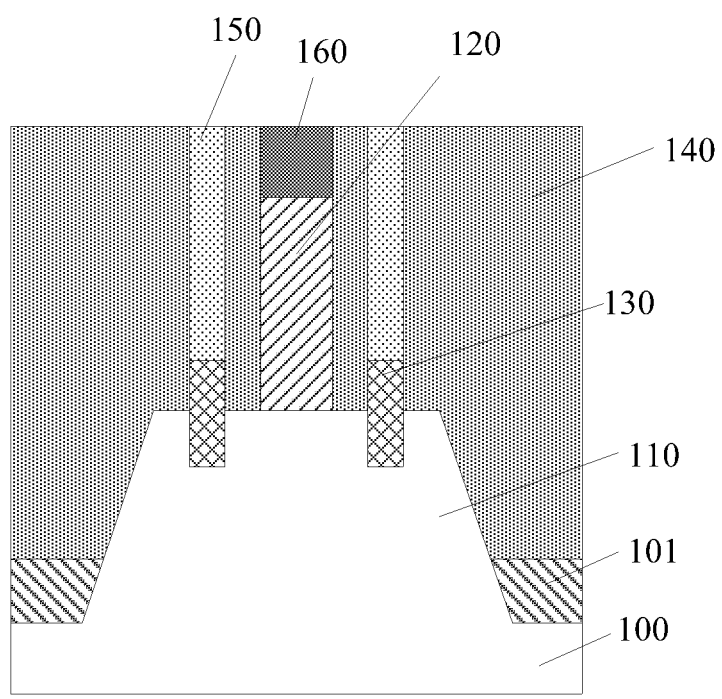
FIG. 1 illustrates an exemplary semiconductor device.

FIG. 1 illustrates an exemplary semiconductor device.

The semiconductor device in FIG. 1 may include a substrate 100, fins 110 on a surface of the substrate 100, an isolation layer 101 on the surface of the substrate 100 and covering a portion of sidewalls of the fins 110, a gate structure 120 on the substrate 100 and across the fins 110, source/drain doped layers 120 in a corresponding fin 110 on sides of the gate structure 120, a dielectric layer 140 on the substrate 100 covering a top surface of the dielectric layer 130 and a top surface and sidewalls of the gate structure 120, first conductive structures 150 and a second conductive structure 160 in the dielectric layer 140. The first conductive structures 150 may cover tops of the source/drain doped layers 130. The second conductive structure 160 may cover a portion of the top surface of the gate structure 120.

In the semiconductor device in FIG. 1, the first conductive structures may be used to connect the first metal interconnection layer to the source/drain doped layers, and the second conductive structure may be used to connect the first metal interconnection layer to the gate structure. The second conductive structure may be formed after forming the first conductive structures. There may be no isolation layer between the first conductive structures and the second conductive structure. A short circuit or a leakage may easily happen between the first conductive layers and the second conductive layers during use, resulting in poor performance of the semiconductor device.

The present disclosure provides a semiconductor device and its fabrication method to at least partially alleviate the above problems. In the present disclosure, a second groove may be formed after forming the first conductive structures, and a spacer may be formed on sidewalls of the second groove. Correspondingly, when forming a second conductive structure in the second groove, the second conductive structure may be isolated from a corresponding first conductive structure by the spacer. Leakage between the second conductive structure and an adjacent first conductive structure may be suppressed to improve the performance of the semiconductor device.

Reference will now be made in detail to exemplary embodiments of the disclosure, which are illustrated in the accompanying drawings. Wherever possible, the same reference numbers will be used throughout the drawings to refer to the same or like parts.

Figure 9:
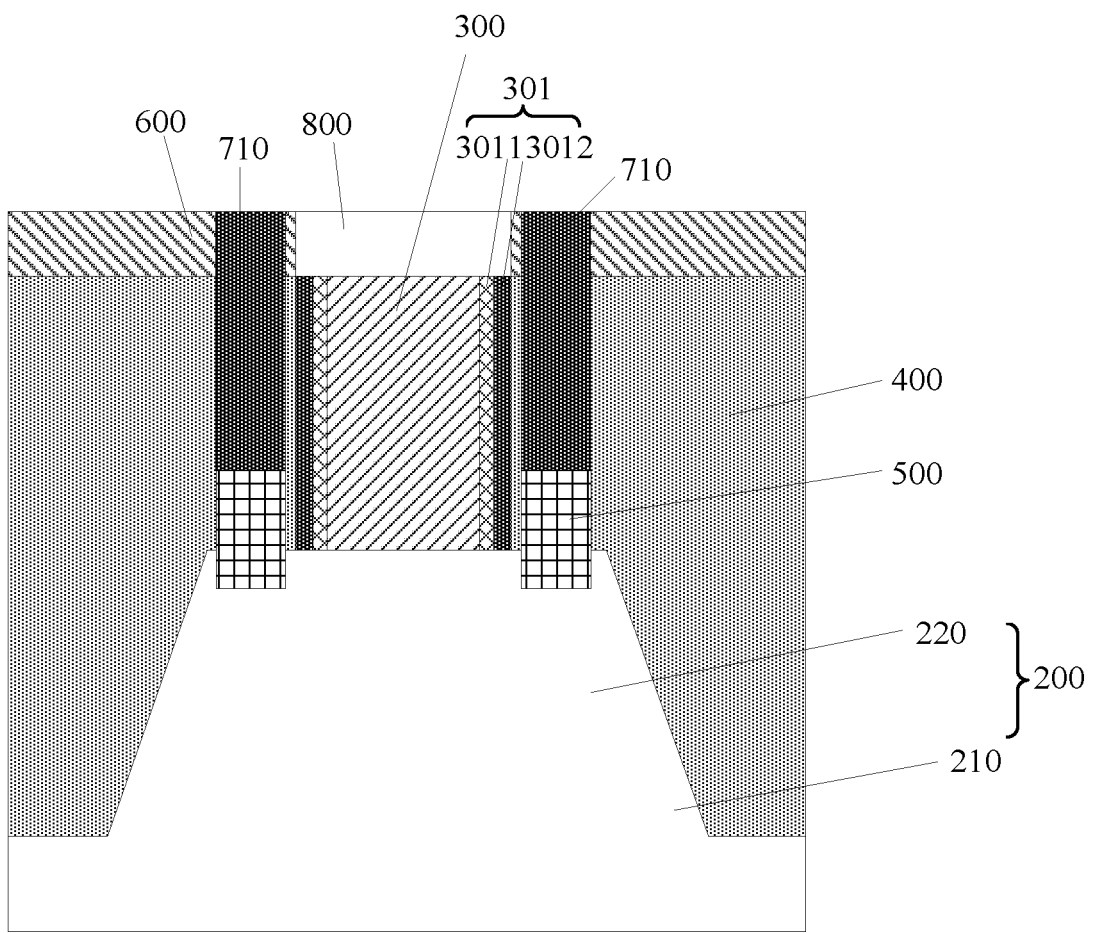
Figure 10:
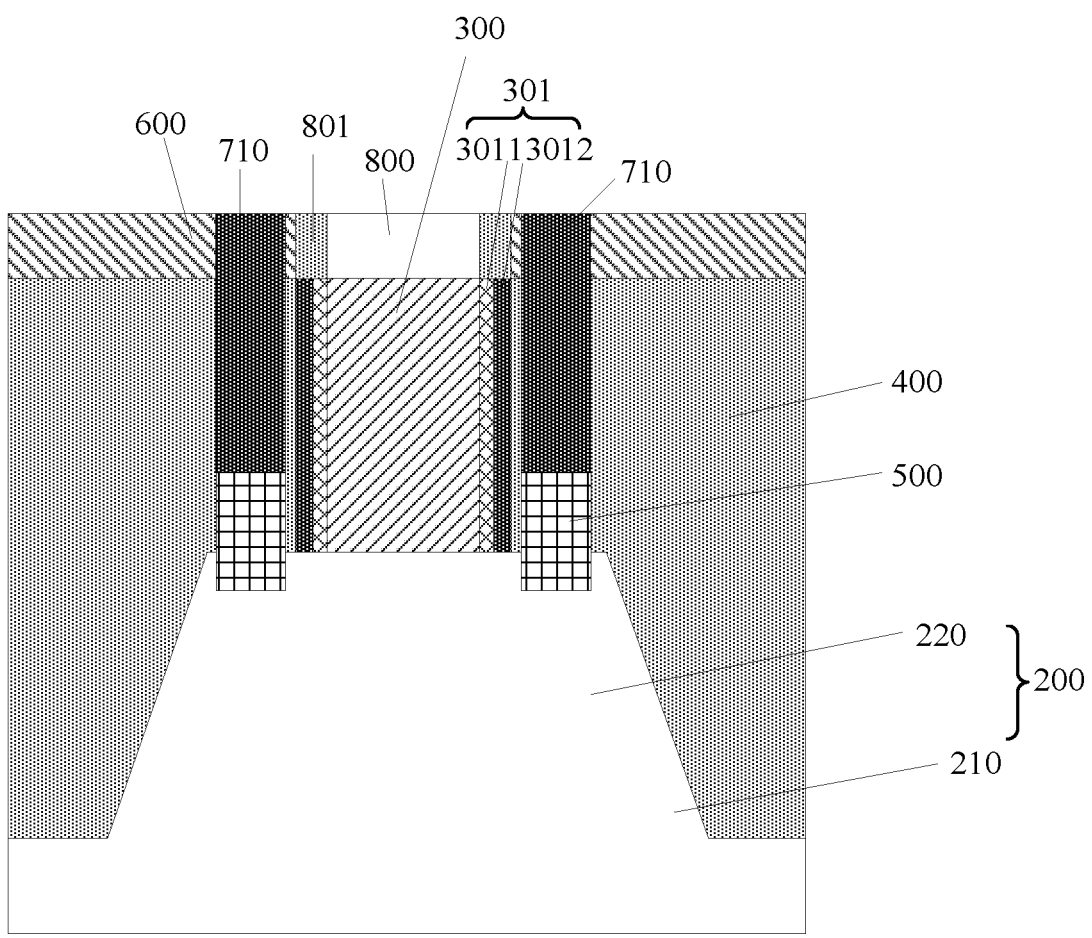
Figure 11:
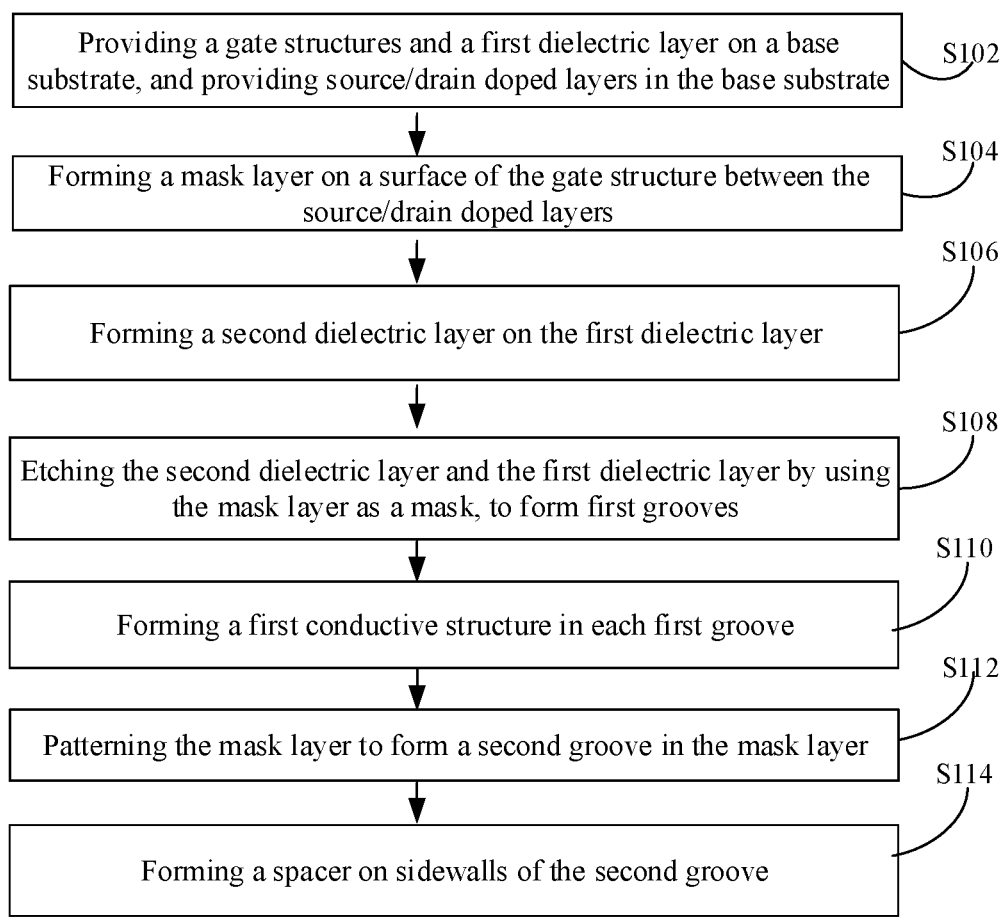
FIG. 11 illustrates an exemplary fabrication method for forming a semiconductor device consistent with various embodiments of the present disclosure.

FIGS. 2-10 illustrate structures corresponding to different steps in a fabrication method for the semiconductor device, and FIG. 11 illustrates a fabrication method for the semiconductor device provided by an embodiment of the present disclosure.

Figure 2:
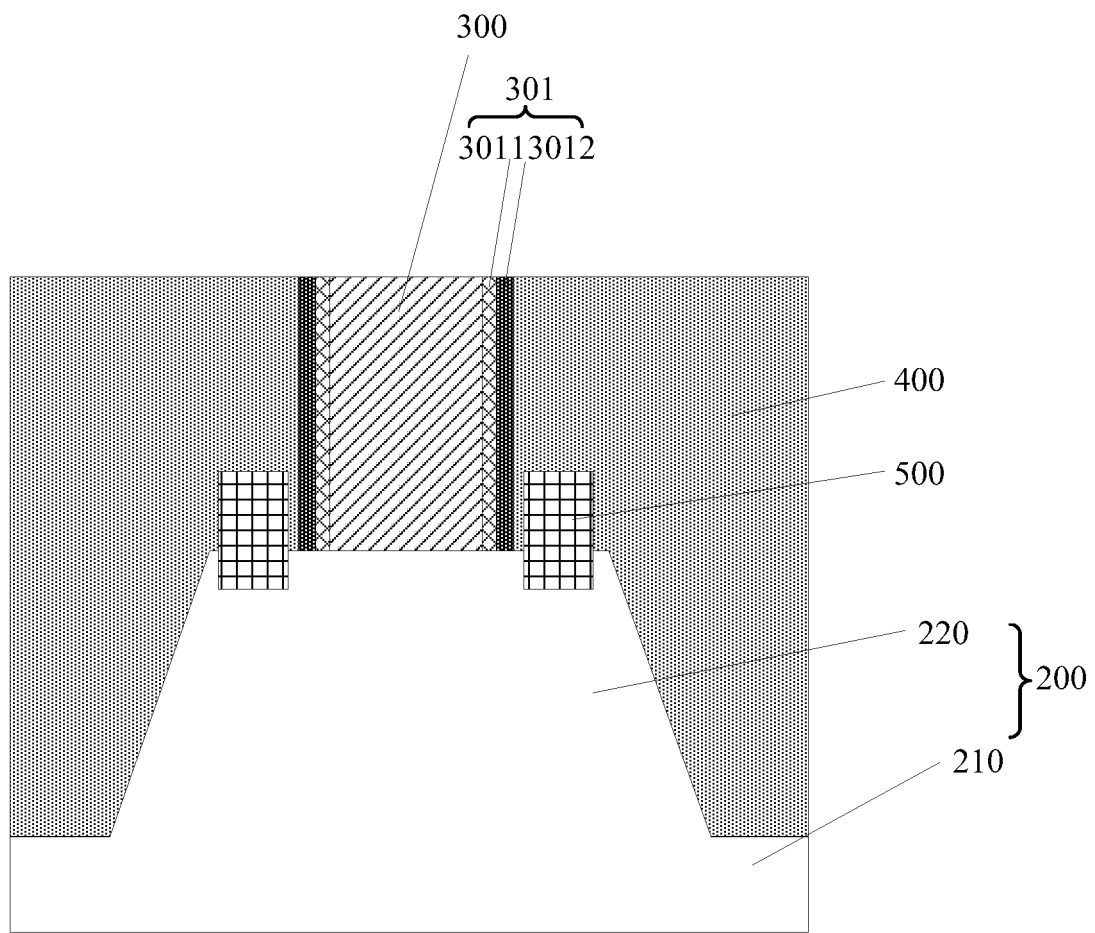
FIGS. 2-10 illustrate semiconductor structures corresponding to certain stages in an exemplary fabrication method for forming an exemplary semiconductor device according to various disclosed embodiments of the present disclosure.
Figure 3:
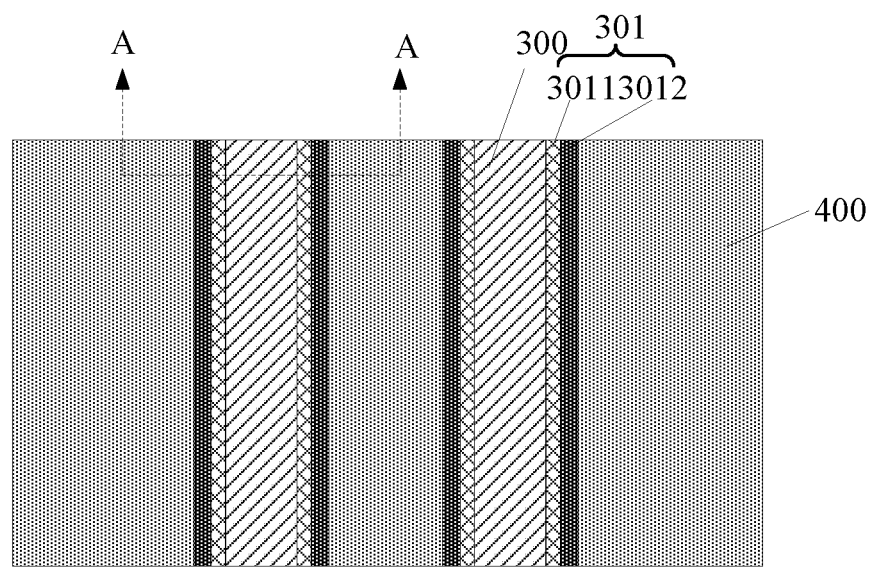

As illustrated in FIGS. 2-3, a base substrate 200 may be provided (e.g., S102 in FIG. 11). A gate structure 300, a first dielectric layer 400, and source/drain doped layers 500 may be formed on the base substrate 200.

FIG. 2 shows a cross-section view along an A-A line in FIG. 3.

In one embodiment, the base substrate 200 may be made of silicon. In other embodiments, the base substrate 200 may be made of a semiconductor material including SiGe, germanium, GaAs, InGaAs, or a combination thereof.

In one embodiment, the base substrate 200 may include a substrate 210 and fins 220 on the substrate 210.

In one embodiment, the fins 220 may be made of silicon. In other embodiments, the fins 220 may be made of a semiconductor material including SiGe.

In one embodiment, the gate structure 300 may be disposed on the base substrate and across the fins 220. The gate structure 300 may be metal gate structures.

In one embodiment, the gate structure 300 may be formed by a gate-last process.

In other embodiments, the gate structure 300 may be formed by a gate-first process.

The source/drain doped layers 500 may be disposed in the base substrate 200 on sides of the gate structure 300.

In one embodiment, the source/drain doped layers 500 may be disposed in a corresponding fin 220 on the sides of the gate structure 300.

In one embodiment, the gate structure 300 may be formed by: form a dummy-gate structure on the substrate 210 and across the fins 220; forming the first dielectric layer 400 covering the substrate 210, tops of the fins 200, and sidewalls of the dummy gate structure; removing the dummy gate structure to form a gate opening in the first dielectric layer 400; forming the gate structure 300 in the gate opening.

In one embodiment, the gate structure 300 may include a gate dielectric layer and a gate layer on the gate dielectric layer. The gate dielectric layer may be made of a high-K dielectric material with K larger than 3.9. The gate layer may be made of a metal including tungsten.

In one embodiment, gate spacers 301 may be formed on sidewalls of the gate structure 300. The gate spacers 301 may be used to define positions of the source/drain doped layers formed subsequently. The gate spacers 301 may also protect the sidewalls of the gate structure 300, to avoid the formation of profile defects in the gate layer formed subsequently and the influence on the performance of the semiconductor device.

In one embodiment, each gate spacer 301 may be a stacked-layer structure including a first gate spacer 3011 and a second gate spacer 3012. In each gate spacer 301, the first gate spacer 3011 may be disposed on a sidewall of the gate structure, and the second gate spacer 3012 may be disposed on sidewalls of the first gate spacer 3011. The first gate spacer 3011 may define a position of a lightly doped region, and the first gate spacer 3011 and the second gate spacer 3012 may define a position of a source/drain doped region.

In one embodiment, before forming the first dielectric layer 400, the source/drain doped layers 500 may be formed in the corresponding fin 200 on sides of the dummy gate structure.

In one embodiment, the source/drain doped layers 500 may be formed by an epitaxial process. In other embodiments, the source/drain doped layers 500 may be formed by an ion implantation process.

In one embodiment, the source/drain doped layers 500 may be formed by: forming grooves in the corresponding fin on the sides of each dummy gate structure; and forming the source/drain doped layers 500 in the grooves by an epitaxial process.

In one embodiment, the source/drain doped layers 500 may include source/drain ions. When the semiconductor device is N-type, the source/drain ions may be N-type conducting ions including phosphor ions. When the semiconductor device is P-type, the source/drain ions may be P-type conducting ions including boron ions.

In one embodiment, the first dielectric layer 400 may be an interlayer dielectric (ILD) layer. The first dielectric layer 400 may be made of a material including $SiN_x$. In other embodiments, the first dielectric layer 400 may be made of a material including SiC or $SiO_2$.

In one embodiment, the first dielectric layer 400 may be formed by a chemical vapor deposition method. In other embodiments, the first dielectric layer 400 may be formed by an atomic layer deposition method or a physical vapor deposition method.

In one embodiment, the first dielectric layer 400 may isolate metal conductive wires from devices.

Figure 4:
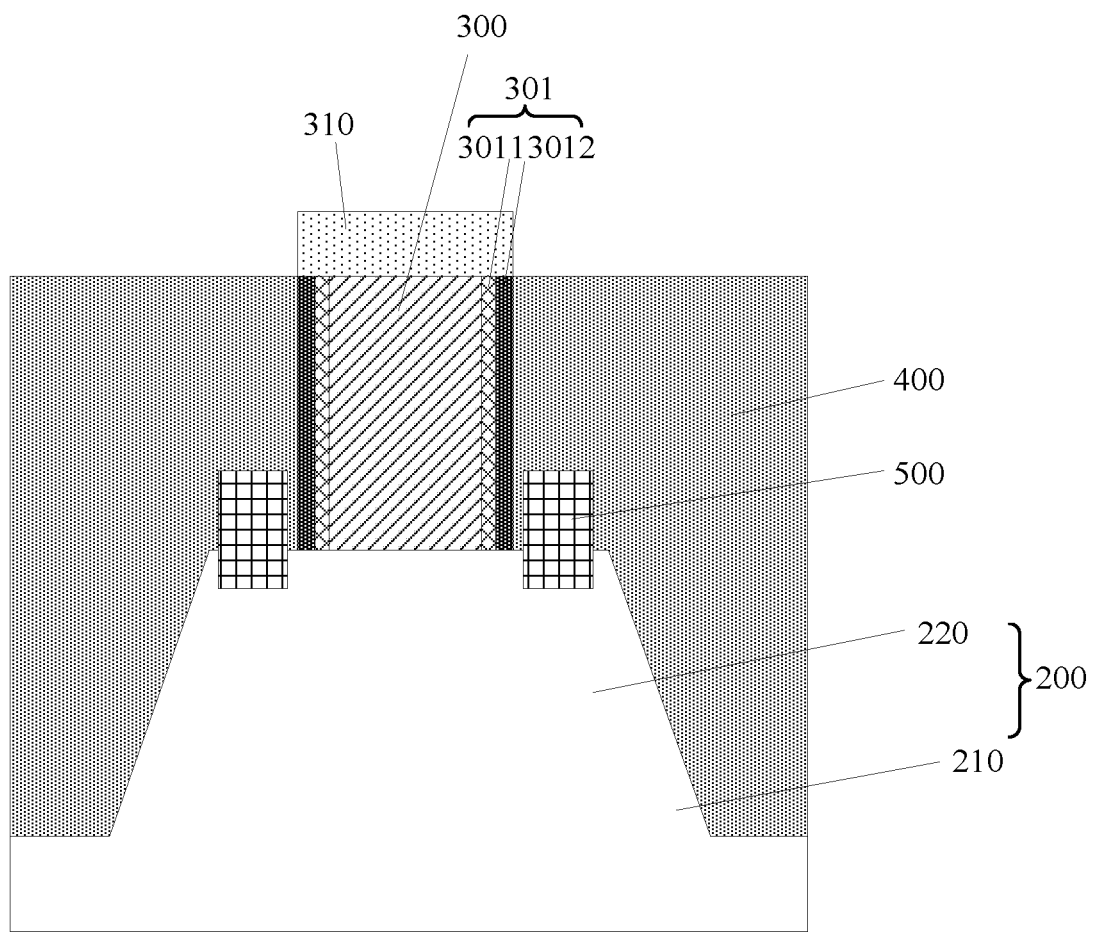
Figure 5:
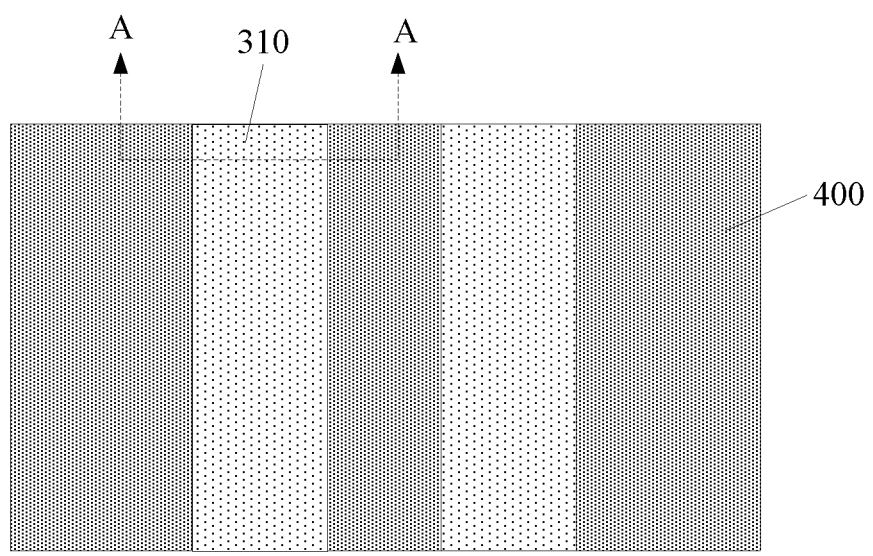

As illustrated in FIGS. 4-5, a mask layer 310 may be formed on a surface of the gate structure 300 between the source/drain doped layers 500 (e.g., S104 in FIG. 11).

FIG. 4 illustrates a cross-section view along an A-A line in FIG. 5.

In various embodiments, the mask layer 310 may be made of a material including $SiN_x$, SiNC, SiNB, SICNO, SiNO, or a combination thereof.

In one embodiment, the mask layer 310 may be made of SiNx.

In one embodiment, the mask layer 310 may be formed on the surface of the gate structure 300 between the source/drain doped layers 500 by a self-aligned double exposure (SADP) process. In other embodiments, the mask layer 310 may be formed by a litho-etch-litho-etch (LELE) process.

In one embodiment, the self-aligned double exposure process may be used to form the mask layer 310, to simplify a process for designing a patterned layer when forming first grooves subsequently. An accuracy of patter transfer and a fabrication efficiency may be improved.

Figure 6:
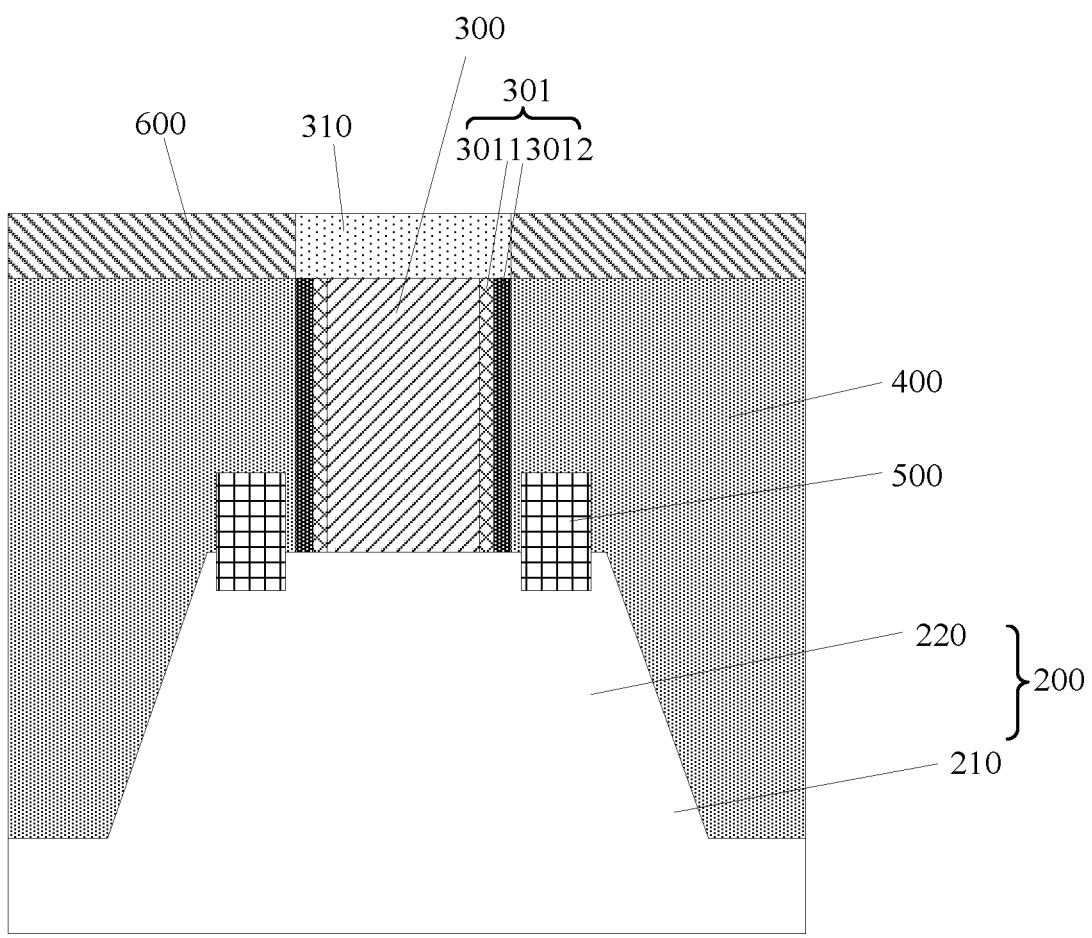

As illustrated in FIG. 6, a second dielectric layer 600 may be formed on the first dielectric layer 400 (e.g., S106 in FIG. 11). The second dielectric layer 600 may expose a surface of the mask layer 310.

In one embodiment, the second dielectric layer 600 may be formed by: forming the second dielectric layer 600 on the surface of the first dielectric layer 400 and on the surface of the mask layer 310; and planarizing the second dielectric layer 600 until the surface of the second dielectric layer 600 exposes the surface of the mask layer 310.

In one embodiment, the second dielectric layer 600 may be an inter-metal-layer dielectric (IMD) layer, and may be made of a material including undoped silicate glass.

In one embodiment, the second dielectric layer 600 may isolate a metal conductive wire from other metal conductive wires.

Figure 7:
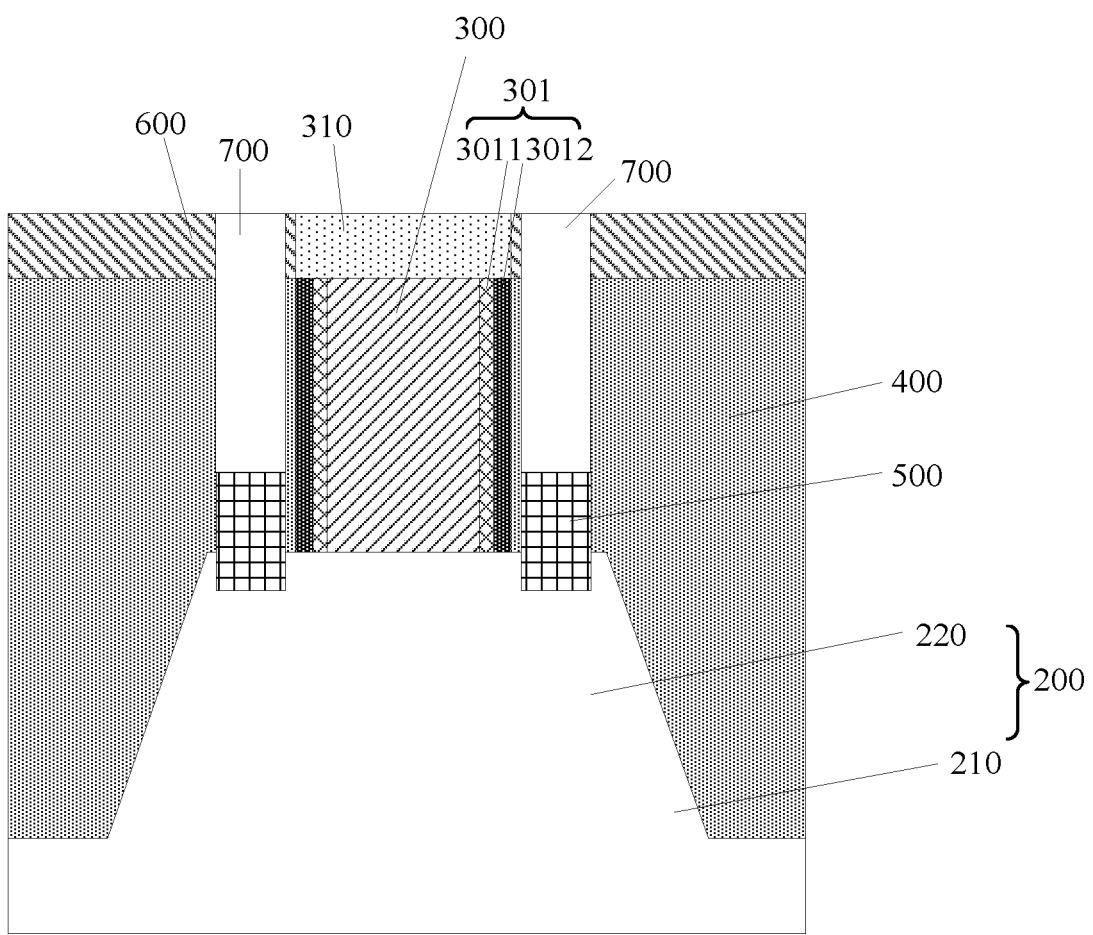

As illustrated in FIG. 7, the second dielectric layer 600 and the first dielectric layer 400 may be etched using the mask layer 310 as an etch mask, to form first grooves 700. The first grooves 700 may expose the source/drain doped layers 400 (e.g., S108 in FIG. 11).

In one embodiment, the second dielectric layer 600 and the first dielectric layer 400 may be etched by a dry etching method to form the first grooves 700.

In one embodiment, the process for etching the second dielectric layer 600 and the first dielectric layer 400 may use: an etching gas including helium (He) gas, $NH_3$ gas, and $NF_3$ gas; a helium gas flow of about 600 sccm to about 2000 sccm; an $NH_3$ gas flow of about 200 sccm to about 5000 sccm; an $NF_3$ gas flow of about 20 sccm to about 2000 sccm; an etching pressure of about 2 mTorr to about 100 mTorr; and an etching time of about 20 s to about 1000 s.

In one embodiment, the mask layer 310 may be formed on the surfaces of the gate structure 300, and may be used as an etch stop layer when etching the first dielectric layer 400 and the second dielectric layer 600, to protect the gate structure 300 under the mask layer 310. The mask layer 310 may be also used as a marker, to simplify the design of a patterned layer for forming the first grooves 700. Correspondingly, the patterned layer may have relatively larger pattern openings, and the process for etching the first dielectric layer 400 and the second dielectric layer 600 may be easier.

Figure 8:
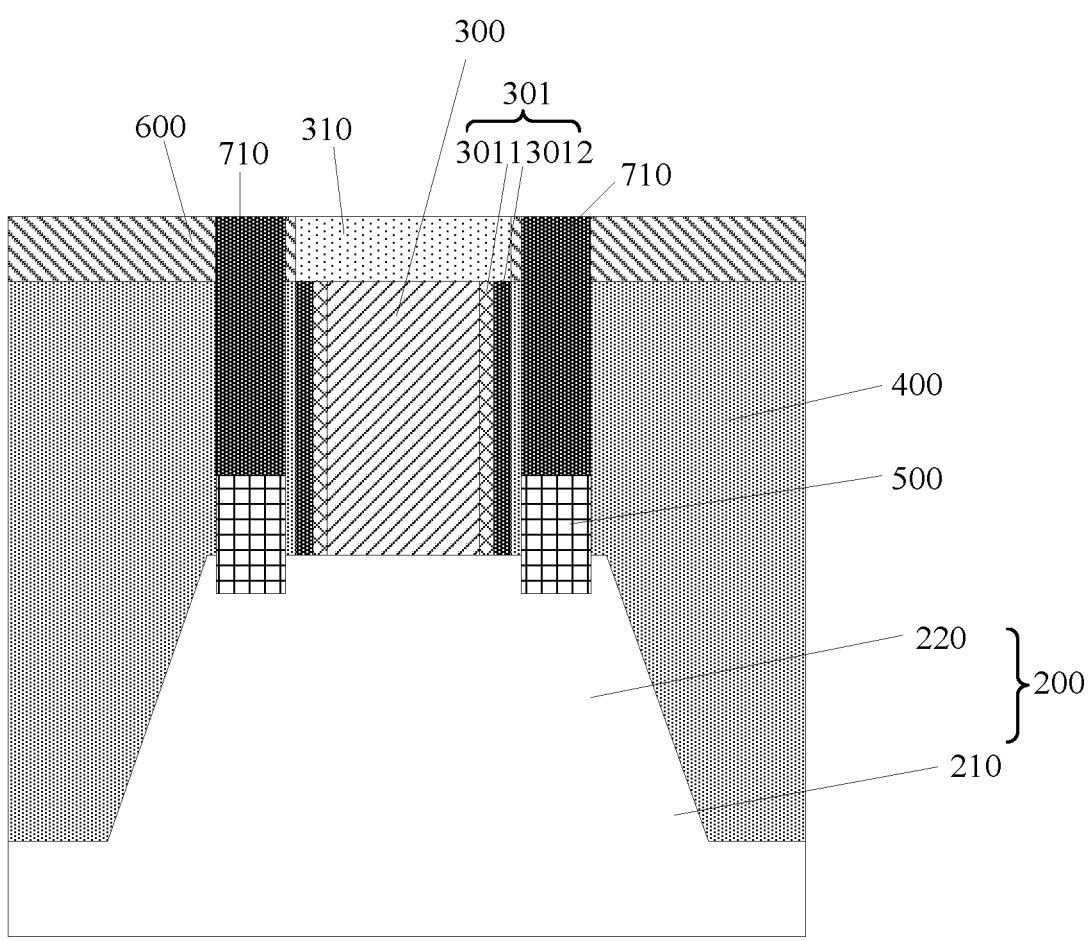

As illustrated in FIG. 8, a first conductive structure 710 may be formed in each first groove 700 (e.g., S110 in FIG. 11).

In one embodiment, first conductive structures 710 may connect the first metal interconnection layer to the source/drain doped layers 500.

In one embodiment, the first conductive structures 710 may be made of a metal including tungsten, cobalt, titanium, nickel, or a combination thereof.

In one embodiment, the first conductive structures 710 may be formed by: forming a first conductive material layer in the first grooves 700 and on the second dielectric layer 600; and planarizing the first conductive material layer until exposing the surface of the second dielectric layer 600, to form a first conductive structure 710 in each first groove 700.

As illustrated in FIG. 9, the mask layer 310 may be patterned to form a second groove 800 in the mask layer 310 (e.g., S112 in FIG. 11). The second groove 800 may expose the gate structure 300 at a bottom of the second groove 800.

In one embodiment, the second groove 800 may expose the top of the gate structure 300.

In one embodiment, the mask layer 310 may be patterned by: forming a patterned layer on the mask layer 310; and etching a portion of the mask layer 310 by using the patterned layer as an etch mask, to form the second groove 800 in the mask layer 310.

In one embodiment, the mask layer 310 may be etched by a dry etching method. The dry etching method may use: a gas including $CF_4$ with a flow of about 20 sccm to about 200 sccm and $CH_3F$ with a flow of about 20 sccm to about 50 sccm; an RF power of about 200 W to about 500 W; and a chamber pressure of about 1 torr to about 10 torr.

In one embodiment, the second groove 800 may be formed by patterning the mask layer 310. The self-aligned patterned layer may be formed and the process may be simplified.

As illustrated in FIG. 10, a spacer 801 may be formed on sidewalls of the second groove 800 (e.g., S114 in FIG. 11).

In one embodiments, the spacer 801 may be made of $SiN_x$. In other embodiments, the spacer 801 may be made of a material including SiC.

In one embodiment, because of the spacer 801, a distance between the second conductive structure and a corresponding first conductive structure 710 may be increased, and correspondingly a first conductive structure 710 may be isolated from the second conductive structure. A short circuit or leakage between the second conductive structure and an adjacent first conductive structure 700 may be suppressed. The performance of the semiconductor device may be improved. A lifetime and application range of the semiconductor device may also be enhanced.

The present disclosure also provides a semiconductor device formed by above fabrication methods. As illustrated in FIG. 10, the semiconductor device may include: a base substrate 200 including a substrate 210 and fins 220 on the substrate 210; a gate structure 300 on the base substrate 200 and across the fins 220; gate spacers 301 on sidewalls of the gate structure 300; source/drain doped layers 500 in the base substrate 200 and on sides of the gate structure 300; a first dielectric layer 400 on the base substrate 200 and covering the source/drain doped layers 500; a mask layer 310 on a top of the gate structure 300 between the source/drain doped layers 500; a second dielectric layer 600 on the first dielectric layer 400 and exposing a surface of the mask layer 310; first grooves 700 in the second dielectric layer 600 and the first dielectric layer 400; first conductive structures 710 in the first grooves 700; a second groove 800 in the mask layer 301; and a spacer 801 on sidewalls of the second groove 800. Each gate spacer 301 including a first gate spacer 3011 on sidewalls of a corresponding gate structure 300 and a second gate spacer 3012 on sidewalls of the first gate spacer 3011. Bottoms of the first grooves 700 may expose the source/drain doped layers 500, and a bottom of the second groove 800 may expose the gate structure 300.

The present disclosure also provides another fabrication method for forming a semiconductor device. FIGS. 12-21 illustrates semiconductor structures corresponding to different steps in an exemplary fabrication method for forming a semiconductor device, and FIG. 22 illustrates an exemplary fabrication method, consistent with various embodiments of the present disclosure.

Figure 12:
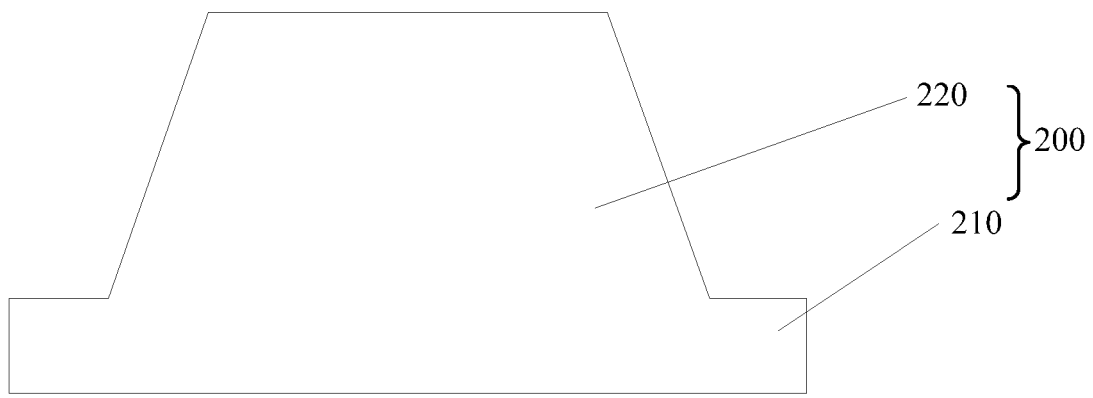
FIGS. 12-21 illustrate semiconductor structures corresponding to certain stages in another exemplary fabrication method for forming an exemplary semiconductor device according to various disclosed embodiments of the present disclosure.
Figure 22:
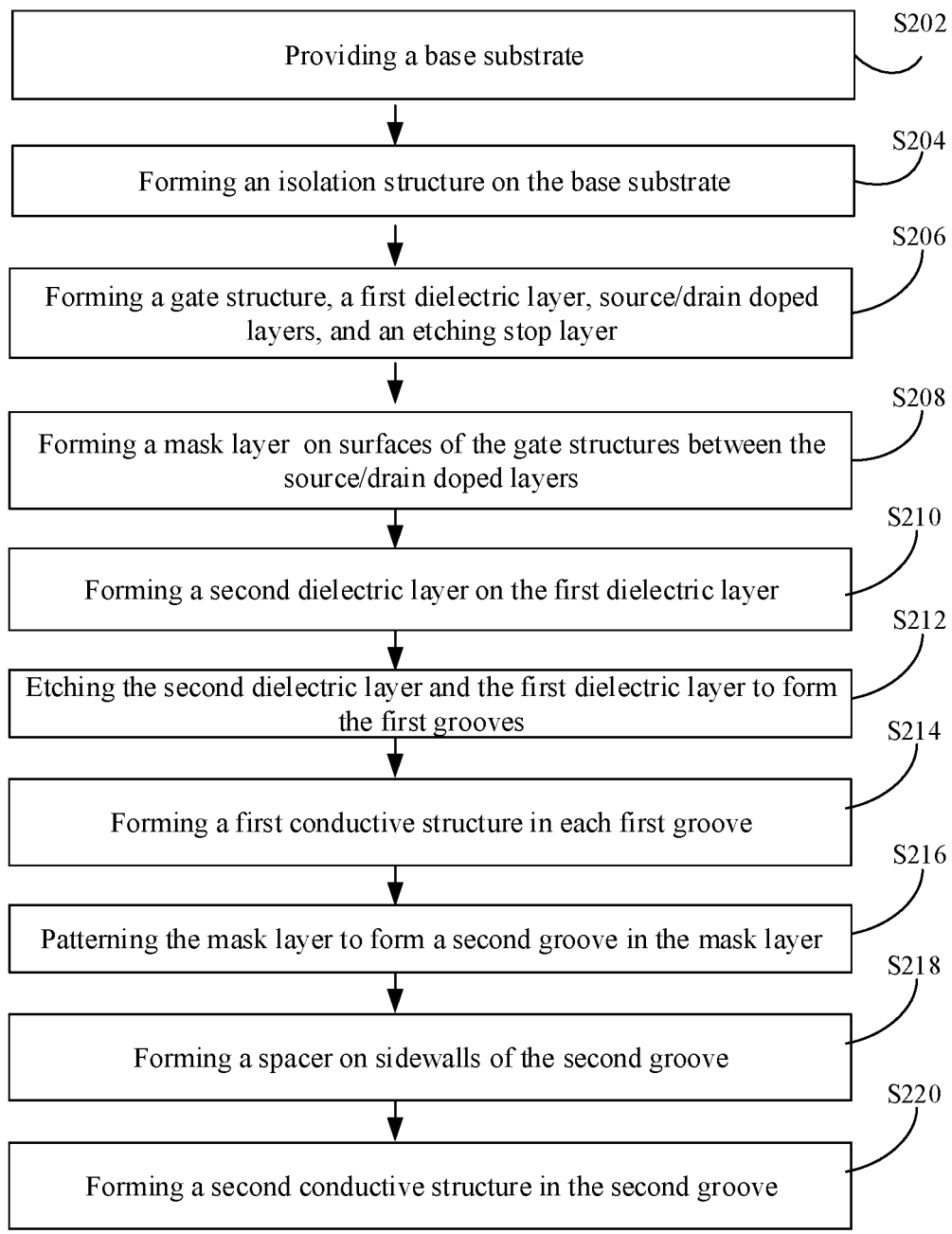
FIG. 22 illustrates another exemplary fabrication method for forming a semiconductor device consistent with various embodiments of the present disclosure.

As illustrated in FIG. 12, a base substrate 200 may be provided (e.g., S202 in FIG. 22).

In one embodiment, the base substrate 200 may include a substrate 210 and fins 220 on the substrate 210.

In one embodiment, the substrate 210 may be made of silicon. In other embodiments, the substrate 210 may be made of a semiconductor material including SiGe, GaAs, or a combination thereof.

In one embodiment, the fins 220 may be formed by: depositing a fin film on the substrate 210; and patterning the fin film to form the fins on the substrate 200.

In one embodiment, the fins 220 may be made of a material including silicon.

Figure 13:
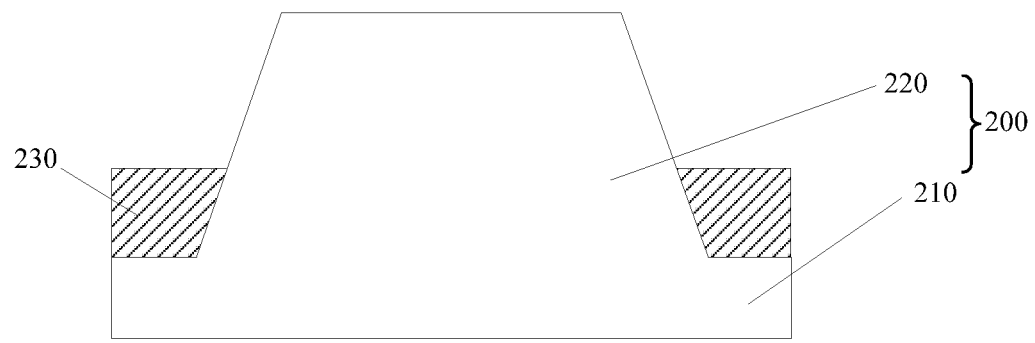

As illustrated in FIG. 13, an isolation structure 230 may be formed on the base substrate 200 (e.g., S204 in FIG. 22).

In one embodiment, the isolation structure 230 may be formed on the base substrate 200. In some other embodiments, the isolation structure 230 may not be formed on the base substrate 200.

In one embodiment, the isolation structure 230 may be a short channel isolation structure, and may cover a portion of sidewalls of the fins 220. The isolation structure 230 may be made of a material including $SiO_2$.

Figure 14:
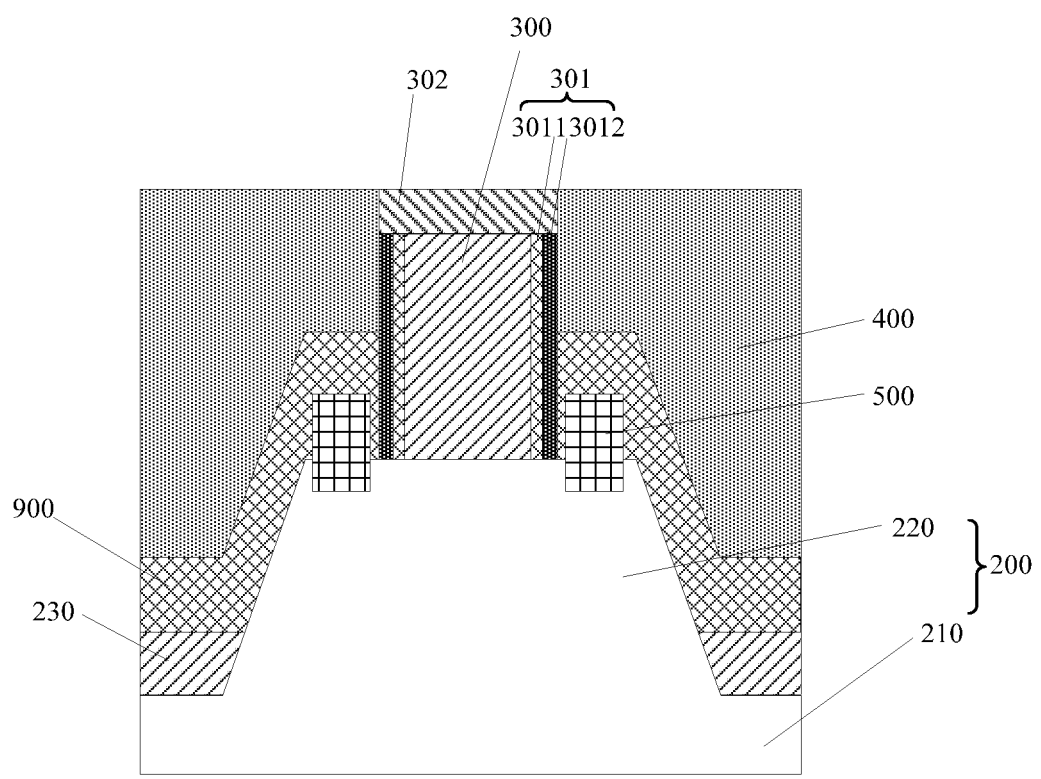

As illustrated in FIG. 14, a gate structure 300, a first dielectric layer 400, source/drain doped layers 500, and an etch stop layer 900 may be formed on the base substrate 200 (e.g., S206 in FIG. 22).

In one embodiment, the gate structure 300, the first dielectric layer 400, and the source/drain doped layers 500 may be formed similarly to the previous descriptions.

In one embodiment, a hard mask layer 302 may be formed on tops of the gate structure 300. In some embodiments, the hard mask layer 302 may not be formed.

In one embodiment, the etch stop layer 900 may be formed on the substrate 210, on a portion of the sidewalls of the fins 220, on tops and sidewalls of the source/drain doped layers 500, and on the sidewalls of the gate structure 300. In other embodiments, the etch stop layer 900 may not be formed.

In one embodiment, the etch stop layer 900 may be formed after forming the source/drain doped layer, and may function to protect in subsequent processes.

In one embodiment, the etch stop layer 900 may be made of $SiO_2$. In other embodiments, the etch stop layer 900 may be made of a material including $SiN_x$, SiC, SiCO, SiCN, or a combination thereof.

Figure 15:
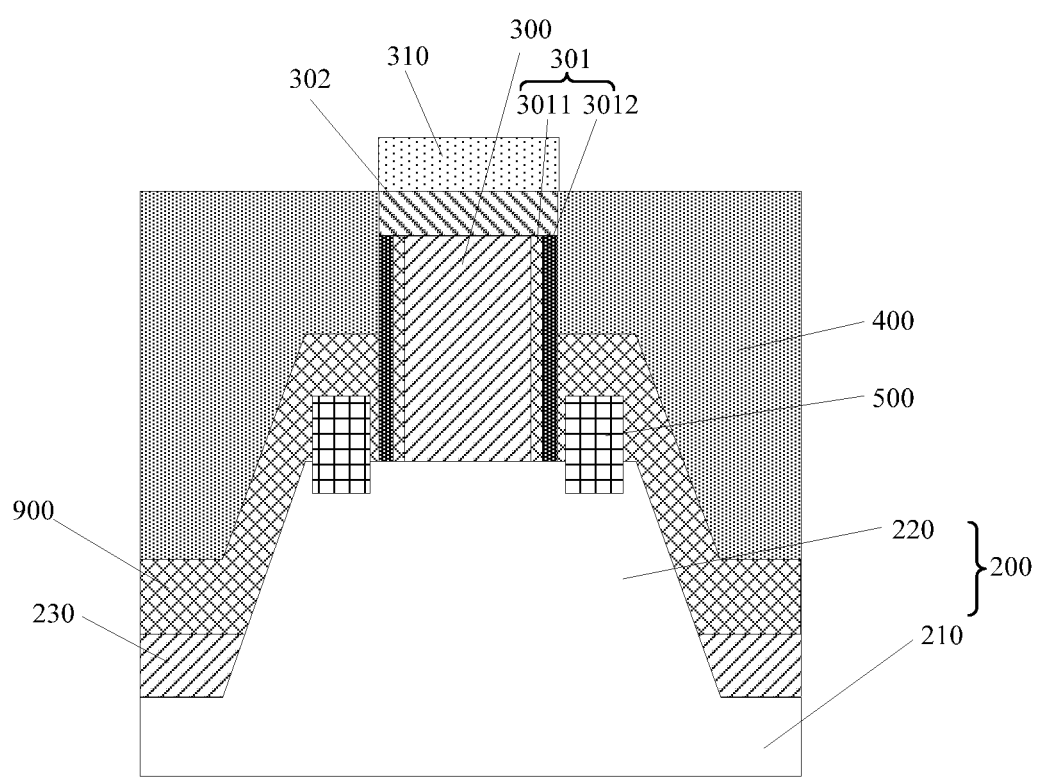

As illustrated in FIG. 15, a mask layer 310 may be formed on a surface of the gate structure 300 between the source/drain doped layers 500 (e.g., S208 in FIG. 22).

In one embodiment, the mask layer 310 may be made of a material including SiCNO.

In one embodiment, the mask layer 310 may be formed on a surface of the hard mask layer 302.

In one embodiment, the mask layer 310 may be formed the surface of the hard mask layer 302 by the litho-etch-litho-etch (LELE) process.

Figure 16:
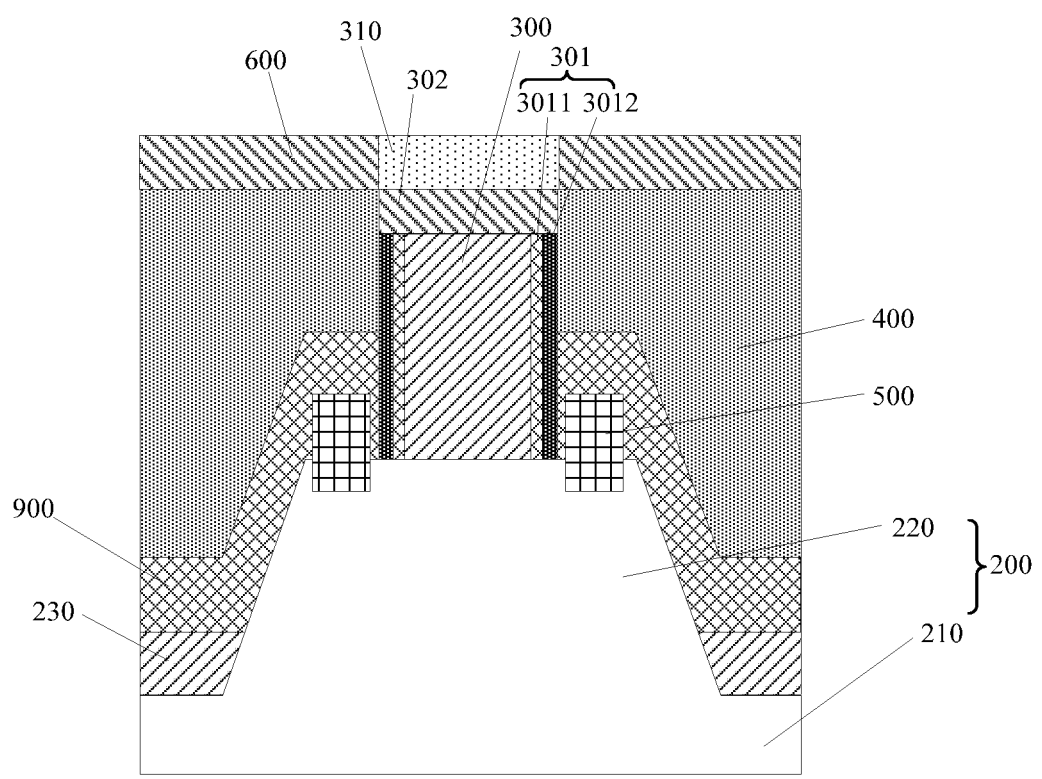

As illustrated in FIG. 16, a second dielectric layer 600 may be formed on the first dielectric layer 400 (e.g., S210 in FIG. 22). A surface of the second dielectric layer 600 may expose a surface of the mask layer 310.

In one embodiment, the second dielectric layer 600 may be formed by a method similar to previous embodiments.

Figure 17:
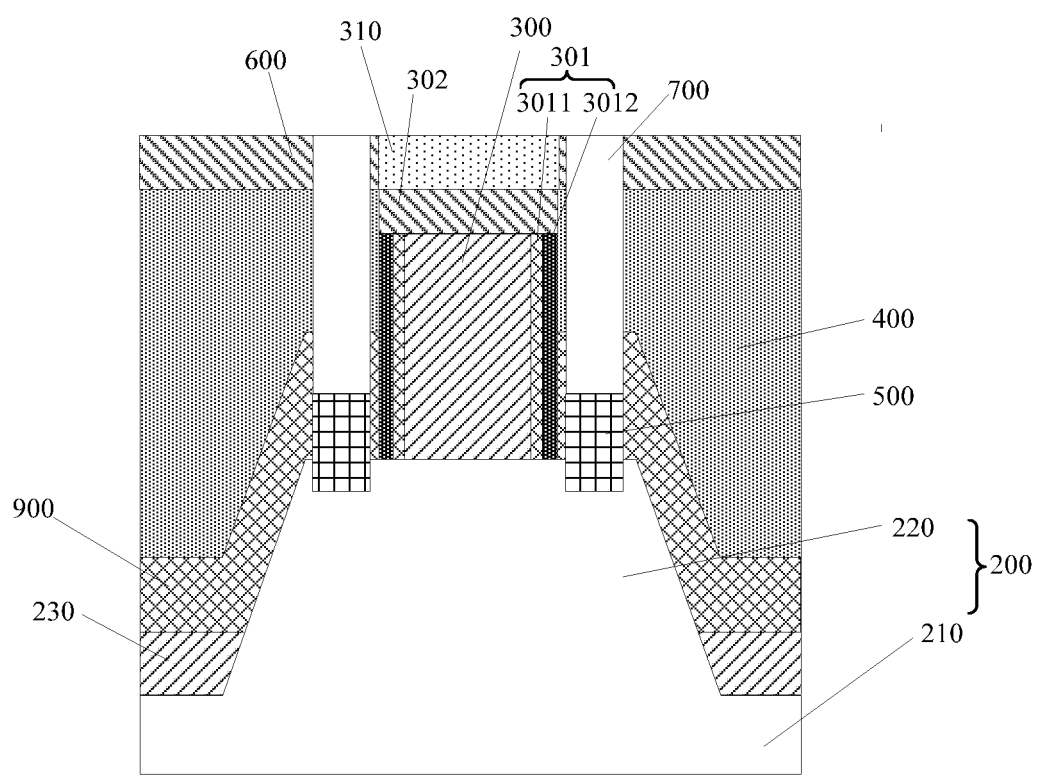

As illustrated in FIG. 17, the second dielectric layer 600 and the first dielectric layer 400 may be etched by using the mask layer 310 as a mask, to form first grooves 700. Bottoms of the first grooves 700 may expose the source/drain doped layers 400 (e.g., S212 in FIG. 22).

In one embodiment, a method similar to previous embodiments may be used to form the first grooves. In other embodiments, a different method may be used to form the first grooves.

Figure 18:
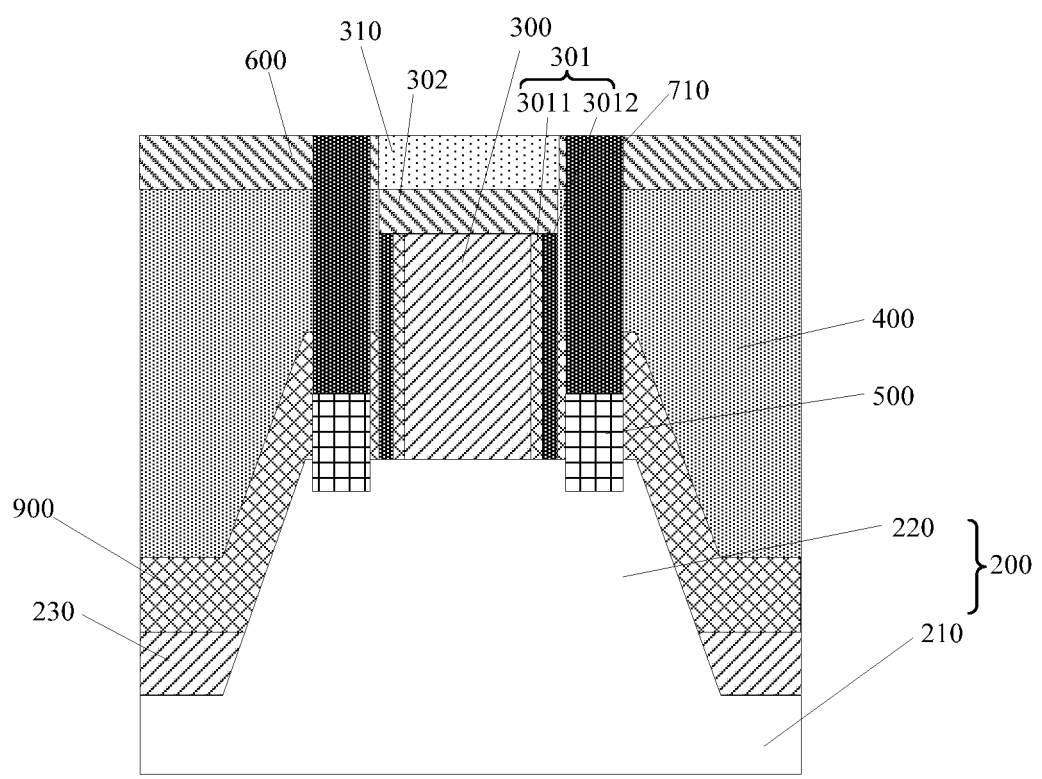

As illustrated in FIG. 18, a first conductive structure 710 may be formed in each first groove 700 (e.g., S214 in FIG. 22).

In one embodiment, first conductive structures 710 in the first grooves 700 may be made of a metal including tungsten.

In one embodiment, the first conductive structures 710 may be formed by: depositing an initial first conductive structure material in the first grooves; and planarizing the initial first conductive structure material until exposing the surface of the second dielectric layer 600 and the surface of the mask layer 310, to form the first conductive structures 710 in the first grooves 700.

Figure 19:
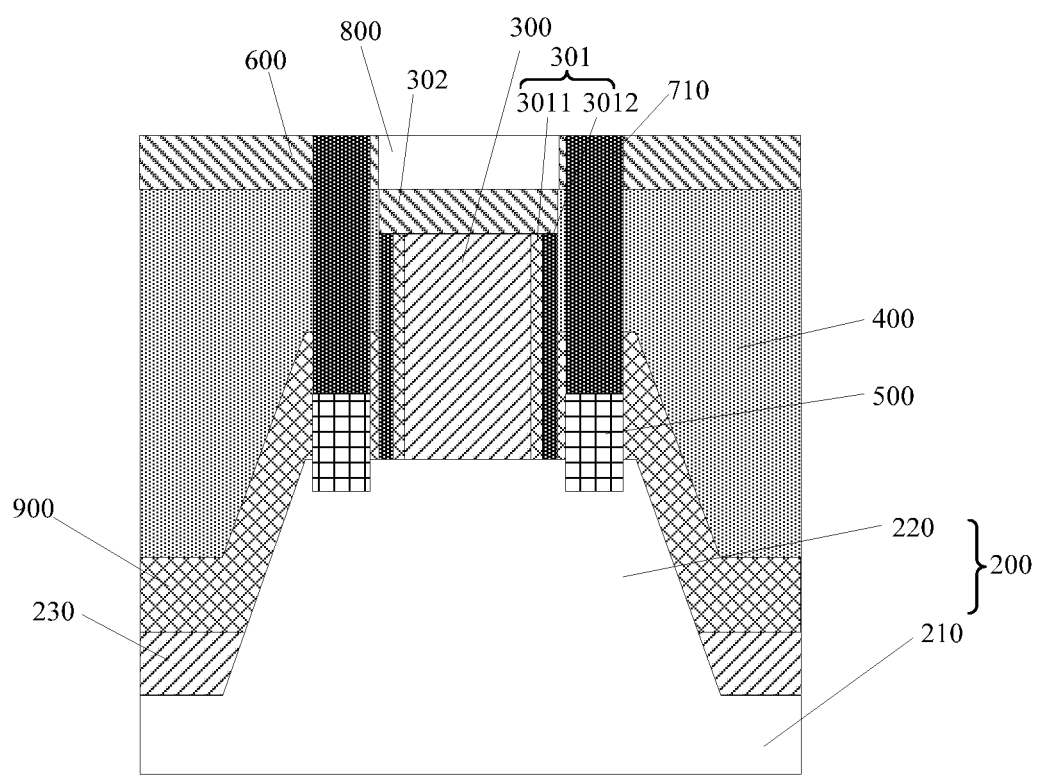

As illustrated in FIG. 19, the mask layer 310 may be patterned to form a second groove 800 in the mask layer 310 (e.g., S216 in FIG. 22). The second groove 800 may expose a top of the hard mask layer 302.

In one embodiment, the second groove 800 may be formed by a method similar to previous embodiments.

Figure 20:
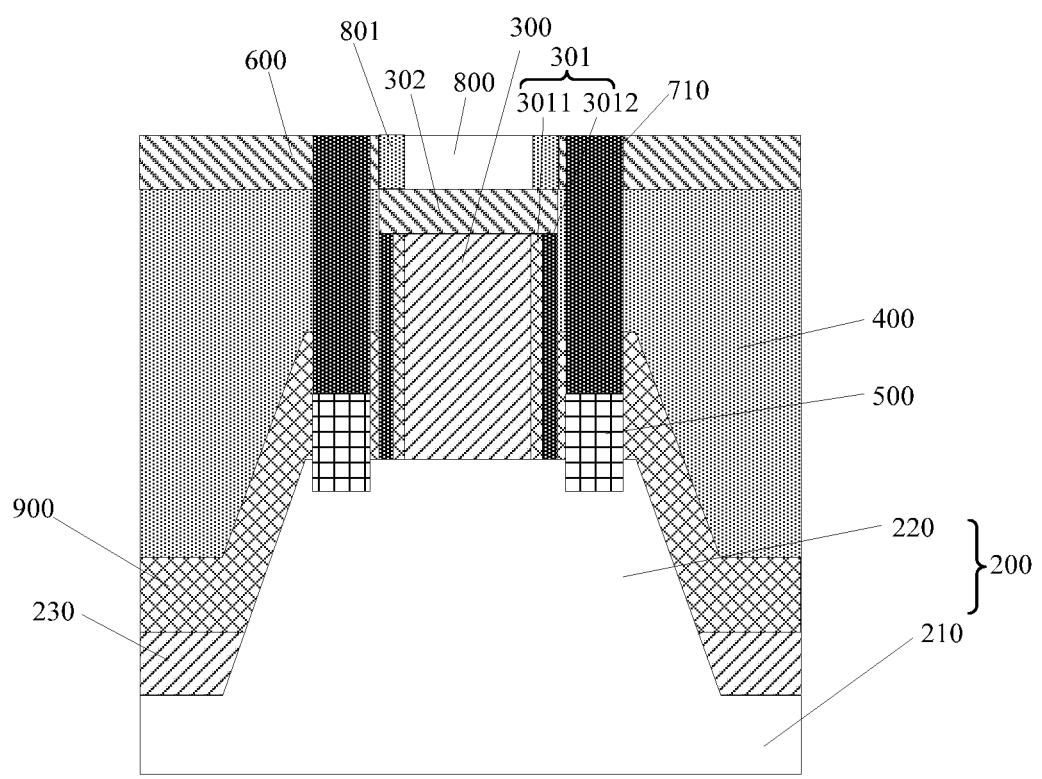

As illustrated in FIG. 20, a spacer 801 may be formed on sidewalls of the second groove 800 (e.g., S218 in FIG. 22).

In one embodiment, the spacer 801 may be made of $SiN_x$. In other embodiments, the spacer 801 may be made of a material including SiC, $SiO_2$, SiCO, or a combination thereof.

In one embodiment, the spacer 801 may have a single-layer structure. In other embodiments, the spacer 801 may have a stacked-layer structure.

In one embodiment, the spacer 801 may be disposed on a top of a corresponding first gate spacer 3011, on a top of a corresponding second gate spacer 3012, and on the sidewalls of a corresponding second groove 800. A thickness of the spacer 801 may equal to a sum of a thickness of a corresponding first gate spacer 3011 and a thickness of the corresponding second gate spacer 3012.

In other embodiments, the thickness of the spacer 801 may be different from the sum of the thickness of the corresponding first gate spacer 3011 and the thickness of the corresponding second gate spacer 3012.

Figure 21:
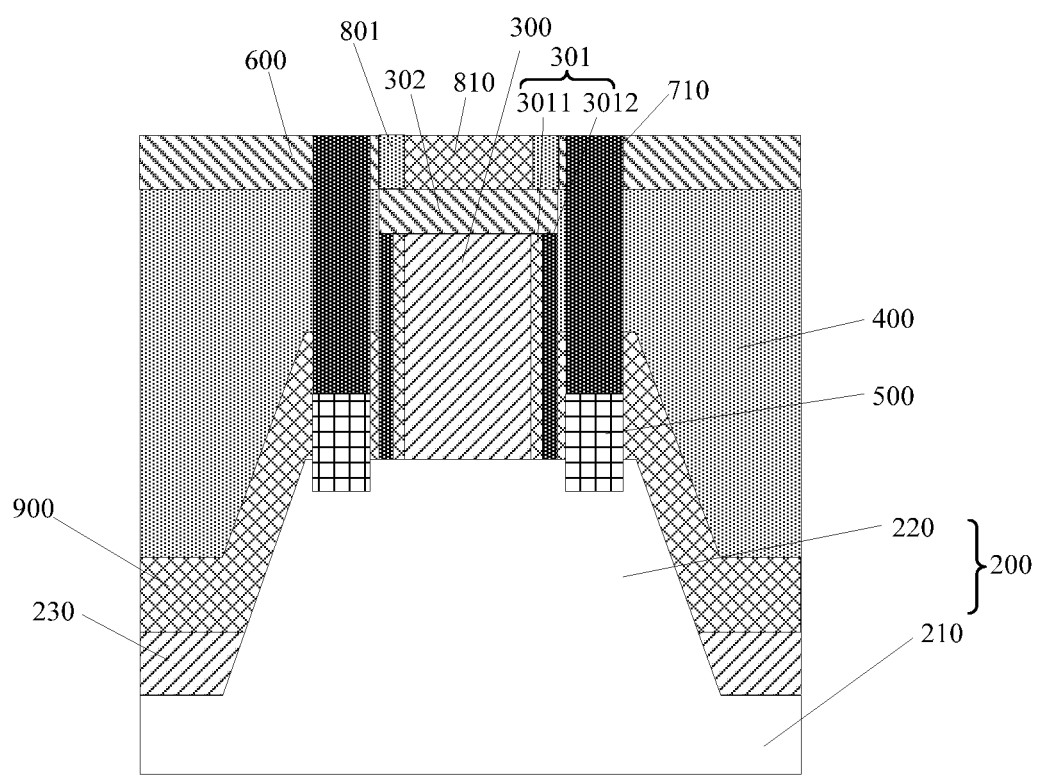

As illustrated in FIG. 21, a second conductive structure 810 may be formed in the second groove 800 (e.g., S220 in FIG. 22).

In one embodiment, the second conductive structure 810 may be used to connect the gate structure 300 to a first metal interconnection layer formed subsequently.

In one embodiment, the second conductive structure 810 in the second groove 800 may be formed by: depositing an initial second conductive material layer in the second groove 800 and on the second dielectric layer 600; planarizing the initial second conductive material layer until exposing the surface of the second dielectric layer to form the second conductive structure 810 in the second groove 800.

The present disclosure also provides another semiconductor device. As illustrated in FIG. 21, the semiconductor device may include: a base substrate 200 including a substrate 210 and fins 220; an isolation structure 230 on the base substrate 200; a gate structure 300 on the base substrate 200; gate spacers 301 on sidewalls of the gate structure 300 where each gate spacer 301 includes a first gate spacer 3011 on sidewalls of a corresponding gate structure 300 and a second gate spacer 3012 on sidewalls of the first gate spacer 3012; a hard mask layer 302 on tops of the gate structure 300; source/drain doped layers 500 in the base substrate 200 at sides of the gate structure 300; a first dielectric layer 400 on the base substrate 200 covering the source/drain doped layers 500; a mask layer 310 on a top of the gate structure 300 between the source/drain doped layers 500; a second dielectric layer 600 on the first dielectric layer exposing a surface of the mask layer 310; first grooves 700 on the second dielectric layer 600 and in the first dielectric layer 400; second grooves 800 in the mask layer 310 where bottoms of the second groove 800 expose a top of the hard mask layer 302; a spacer 801 on sidewalls of the second groove 800; and a second conductive structure 810 in the second groove 800.

In the present disclosure, the second dielectric layer and the first dielectric layer may be etched by using the mask layer as the mask to form the first grooves. A first conductive structure may be formed in each first groove. The mask layer may be patterned to form the second grooves in the mask layer. A spacer may be formed on the sidewalls of each second groove. Correspondingly, when forming a second conductive structure in each second groove, a corresponding spacer in the second groove may increase a distance between the second conductive structure and a corresponding first conductive structure, and then separate the second conductive structure and a corresponding first conductive structure. A short circuit and/or leakage between the second conductive structure and a corresponding first conductive structure may be suppressed. The performance of the semiconductor device may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device, comprising:
a base substrate;
a gate structure on the base substrate;
source/drain doped layers in the base substrate on sides of the gate structure;
a first dielectric layer on the base substrate and exposing the source/drain doped layers;
a mask layer covering a top surface of the gate structure between the source/drain doped layers;
a second dielectric layer on the first dielectric layer and exposing a top surface of the mask layer;
a first conductive structure on top surfaces of the source/drain layers, sidewalls of the first conductive structure being in contact with sidewalls of the first dielectric layer and first sidewalls of the second dielectric layer;
spacers on the top surface of the mask layer, sidewalls of the spacers being in contact with second sidewalls of the second dielectric layer; and
a second conductive structure on the top surface of the mask layer,
the spacers being sandwiched between the second dielectric layer and the second conductive structure, and
a portion of the second dielectric layer being between the spacers and the first conductive structure.

2. The device according to claim 1, wherein:
the mask layer is made of a material including $SiN_x$, SiNC, SiNB, SiCNO, SiNO, or a combination thereof.

3. The device according to claim 1, wherein:
the base substrate includes a substrate and fins on the substrate;
the gate structure is disposed on the substrate and across the fins; and
the source/drain doped layers are disposed in a corresponding fin on the sides of the gate structure.

4. The device according to claim 3, further including:
an isolation structure on the substrate and covering a portion of sidewalls of the fins.

5. The device according to claim 4, further including:
an etch stop layer on the substrate, on a portion of the sidewalls of the fins, on the top surfaces and sidewalls of the source/drain doped layers, and on sidewalls of the gate structure.

6. The device according to claim 1, wherein:
the first dielectric layer is made of a material including $SiO_2$, SiC, SiNO, $SiN_x$, or a combination thereof.

7. The device according to claim 1, wherein:
the second dielectric layer is made of a material including undoped silicate glass.

8. The device according to claim 1, wherein:
the first conductive structure is made of a material including tungsten, cobalt, titanium, nickel, or a combination thereof.

9. The device according to claim 1, wherein:
the second conductive structure is made of a material including tungsten, cobalt, titanium, nickel, or a combination thereof.

10. The device according to claim 1, wherein:
a top surface of the second dielectric layer is coplanar with top surfaces of the spacers, a top surface of the first conductive structure, and a top surface of the second conductive structure.

* * * * *